(12) United States Patent
Yang

(10) Patent No.: US 9,060,421 B2
(45) Date of Patent: Jun. 16, 2015

(54) PROJECTION DEVICE

(71) Applicant: Zhongshan Innocloud Intellectual Property Services Co., Ltd., Zhongshan (CN)

(72) Inventor: Chung-Hsing Yang, New Taipei (TW)

(73) Assignee: Zhongshan Innocloud Intellectual Property Services Co., Ltd., Zhongshan (CN)

( * ) Notice: Subject to any disclaimer, the term of this patent is extended or adjusted under 35 U.S.C. 154(b) by 257 days.

(21) Appl. No.: 13/851,705

(22) Filed: Mar. 27, 2013

(65) Prior Publication Data

US 2013/0329361 A1  Dec. 12, 2013

(30) Foreign Application Priority Data

Jun. 8, 2012 (TW) .................................. 101120822

(51) Int. Cl.
*H05K 5/00* (2006.01)
*H05K 5/02* (2006.01)
*F16M 11/10* (2006.01)
*F16M 13/00* (2006.01)
*G03B 21/14* (2006.01)

(52) U.S. Cl.
CPC .............. *H05K 5/0204* (2013.01); *F16M 11/10* (2013.01); *F16M 13/005* (2013.01); *G03B 21/145* (2013.01)

(58) Field of Classification Search
CPC . H05K 5/0204; G03B 21/145; F16M 13/005; F16M 11/00
See application file for complete search history.

(56) References Cited

U.S. PATENT DOCUMENTS

| 5,337,103 | A  | * | 8/1994  | Gulick ........................... 353/119 |
| 6,262,884 | B1 | * | 7/2001  | Hwang et al. ............. 361/679.04 |
| 6,390,627 | B1 | * | 5/2002  | Kuroda ......................... 353/119 |
| 7,641,348 | B2 | * | 1/2010  | Yin et al. ....................... 353/119 |
| 8,011,790 | B2 | * | 9/2011  | Nagashima et al. ............ 353/71 |
| 8,478,366 | B2 | * | 7/2013  | Shin et al. ................... 455/575.1 |
| 2005/0040298 | A1 | * | 2/2005 | Ohki et al. ................. 248/176.1 |
| 2009/0207386 | A1 | * | 8/2009 | Liu et al. ...................... 353/119 |
| 2009/0257182 | A1 | * | 10/2009 | Yang ...................... 361/679.27 |
| 2009/0257183 | A1 | * | 10/2009 | Yang ...................... 361/679.27 |
| 2009/0290298 | A1 | * | 11/2009 | Hsieh et al. ............. 361/679.27 |
| 2010/0208434 | A1 | * | 8/2010 | Kim et al. ..................... 361/729 |
| 2011/0128511 | A1 | * | 6/2011 | Ko et al. ....................... 353/119 |
| 2011/0164368 | A1 | * | 7/2011 | Leng ......................... 361/679.21 |
| 2012/0008265 | A1 | * | 1/2012 | Tanaka et al. ............. 361/679.01 |
| 2012/0057137 | A1 | * | 3/2012 | Enomoto et al. ................ 353/61 |
| 2012/0081677 | A1 | * | 4/2012 | Tanohata et al. ................ 353/57 |
| 2012/0092567 | A1 | * | 4/2012 | Jikuya et al. .................. 348/789 |
| 2012/0281382 | A1 | * | 11/2012 | Tsai et al. ..................... 361/807 |
| 2014/0016295 | A1 | * | 1/2014 | Huang et al. ................. 361/827 |
| 2014/0118704 | A1 | * | 5/2014 | Duelli et al. .................... 353/70 |

* cited by examiner

*Primary Examiner* — Lisa Lea Edmonds
(74) *Attorney, Agent, or Firm* — Novak Druce Connolly Bove + Quigg LLP

(57) ABSTRACT

A projection device includes a housing, a projection module, a support member, and a cover. The housing includes a rear wall and a plurality of side walls extending from the rear wall. A cavity and an accommodating groove are defined in the rear wall. A projection module is pivotably mounted in the cavity and rotatable along a first direction. A support member is pivotably mounted in the accommodating groove and rotatable along a second direction that is reverse to the first direction. The cover is attached to the housing for covering an opening surrounded by the plurality of side walls.

20 Claims, 5 Drawing Sheets

PROJECTION DEVICE

BACKGROUND

1. Technical Field

The present disclosure relates to a projection device.

2. Description of Related Art

A typical projection device includes a projecting portion for projecting image light onto a predetermined projection receiving portion, an image taking portion for taking a projected image obtained by the projecting portion, and a processing portion for performing a predetermined processing based on the image taking result obtained by the image taking portion. However, it's inconvenient to adjust a projection angle of the projection device.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation. In the figures of the accompanying drawings, like references indicate similar elements. It should be noted that references to "an" or "one" embodiment in this disclosure are not necessarily to the same embodiment, and such references mean at least one.

Figure 1:
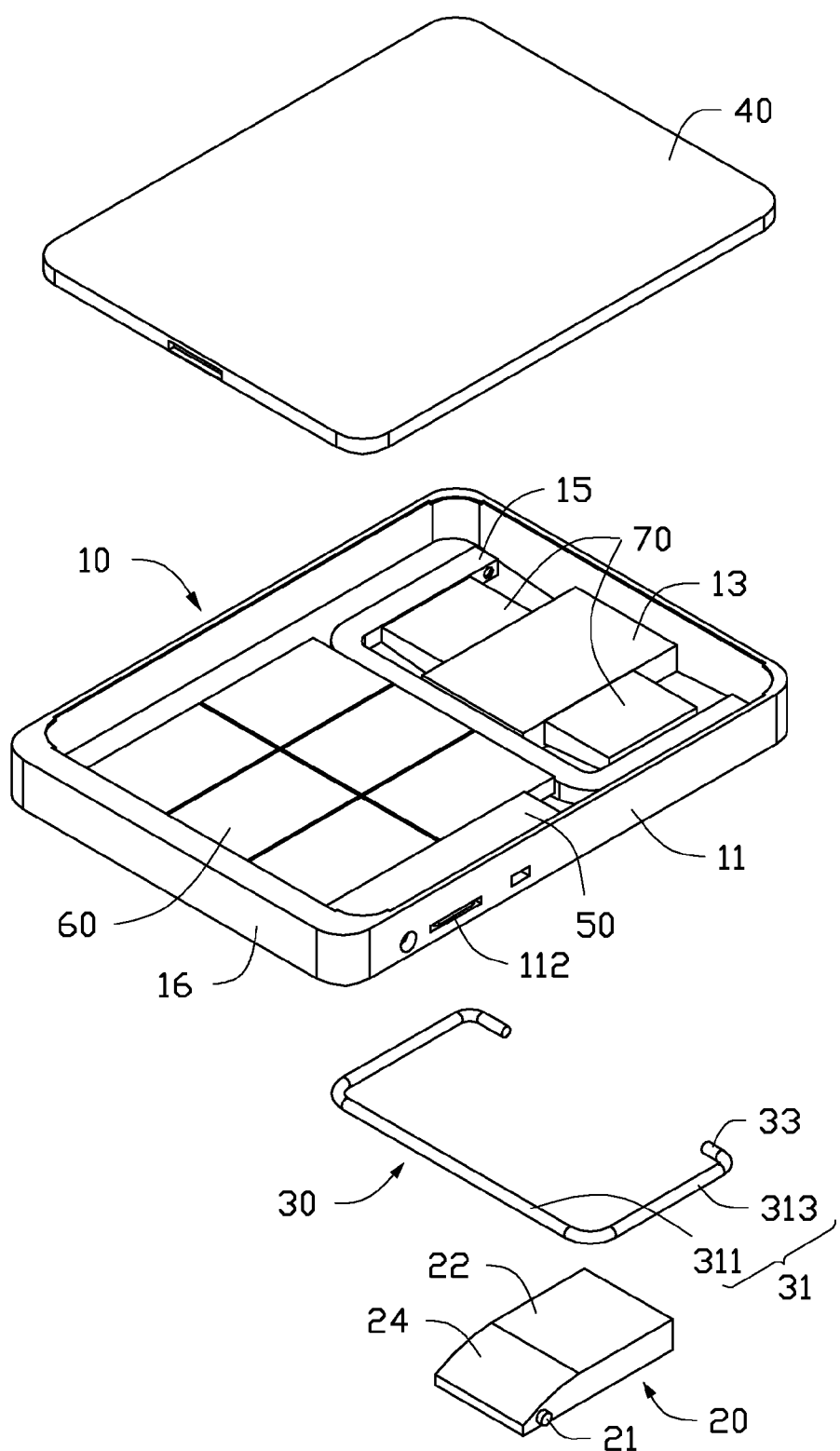
FIG. 1 is an isometric, exploded view of a projection device in accordance with an embodiment.
Figure 2:
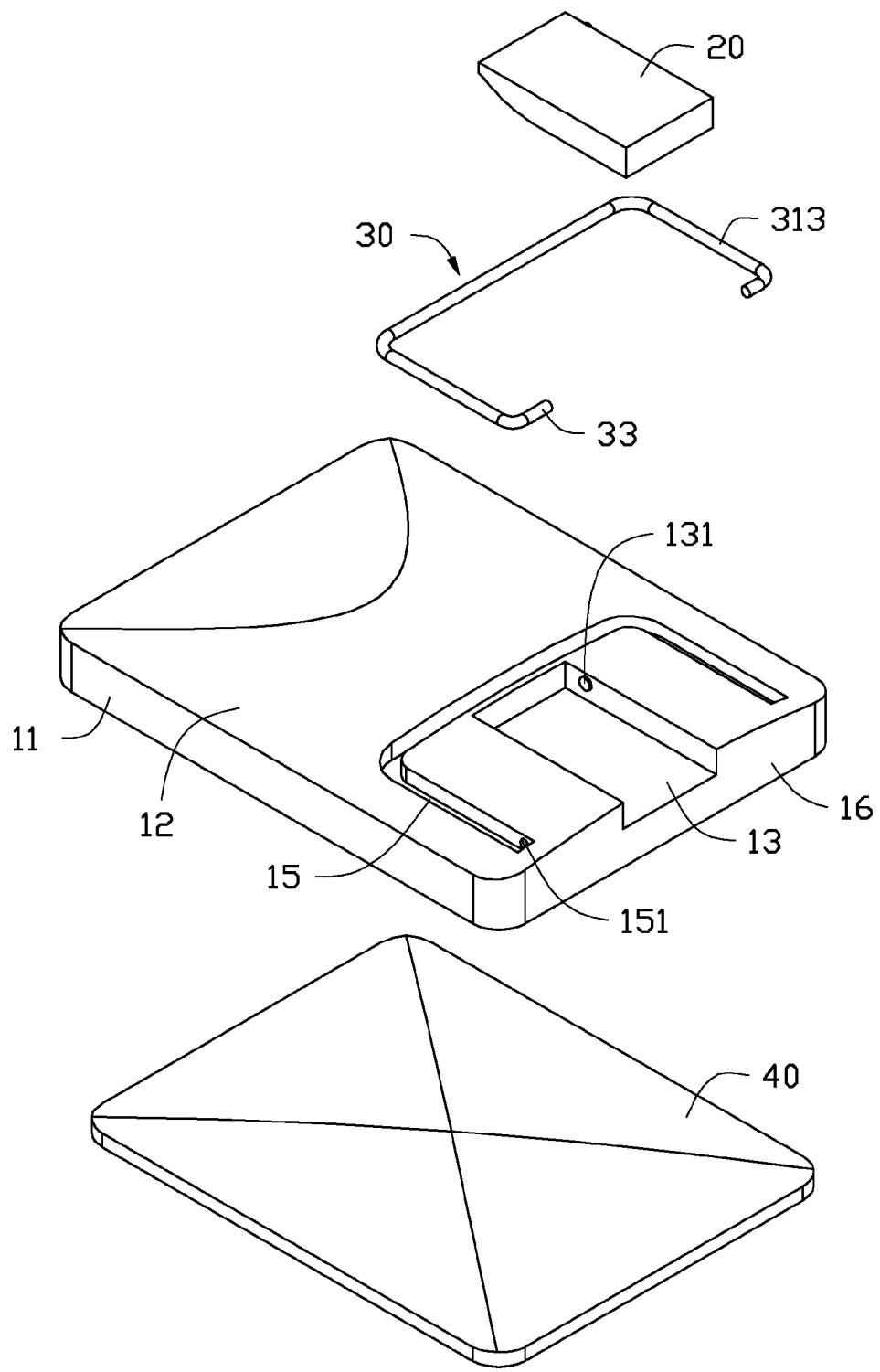
FIG. 2 is similar to FIG. 1, but viewed from another aspect.

Referring to FIGS. 1 to 2, an embodiment of a projection device includes a housing 10, a projection module 20 used for projecting image light onto a projection screen, a support member 30, and a cover 40.

The housing 10 includes a rear wall 12, a pair of first side walls 11, and a pair of second side walls 16. In one embodiment, the rear wall 12 has a rectangular shape. The pair of first side walls 11 extends substantially perpendicularly from a pair of long edges of the rear wall 12. The pair of second side walls 16 extends substantially perpendicularly from a pair of short edges of the rear wall 12. A cavity 13 is defined in the rear wall 12 for mounting the projection module 20. An accommodating groove 15 is defined in the rear wall 12 and surrounds the cavity 13 for mounting the support member 30. The cavity 13 has a rectangular shape. The accommodating groove 15 has a U-shape. A first pivot hole 131 is defined in the rear wall 12 and located beside the cavity 13. A pair of second pivot holes 151 is defined in the rear wall 12 and located beside two ends of the accommodating groove 15.

A plurality of power cells 60 is mounted in the housing 10 for supplying electric power to the projection device. A circuit board 50 is substantially perpendicularly attached to an inner side of one of the pair of the first side walls 11 and located beside the plurality of power cells 60. A pair of speakers 70 is mounted in the housing 10 and located beside opposite sides of the cavity 13. The pair of the speakers 70 and the cavity 13 are located between opposite sides of the accommodating groove 15. The circuit board 50 is electrically connected to and controls the plurality of power cells 60, the projection module 20, and the pair of speakers 70. A connector port 112 is defined in the one of the pair of first side walls 11 and connected to the circuit board 50. The connector port 112 is used to connect to a media storage device which inputs video and audio files to the projection device. In one embodiment, the projection device can project image onto a screen by the projection module 20 and play audio signals by the pair of speakers 70.

The projection module 20 includes a rectangular portion 22 and an arc-shaped portion 24 connected with the rectangular portion 22. A pivot post 21 protrudes from a side surface of the arc-shaped portion 24 corresponding to the first pivot hole 131. The arc-shaped portion 24 becomes thinner gradually from the rectangular portion 22.

The support member 30 includes a main portion 31 and a pair of pivot mounting ends 33 bent from opposite ends of the main portion 31. The main portion 31 has a roughly U shape and includes a horizontal part 311 and a pair of vertical parts 313 substantially perpendicularly extending from opposite ends of the horizontal part 311. The pair of pivot mounting ends 33 extends substantially perpendicularly from the pair of vertical parts 313. In one embodiment, the support member 30 is integrally formed and made from a long, slim rod.

Figure 3:
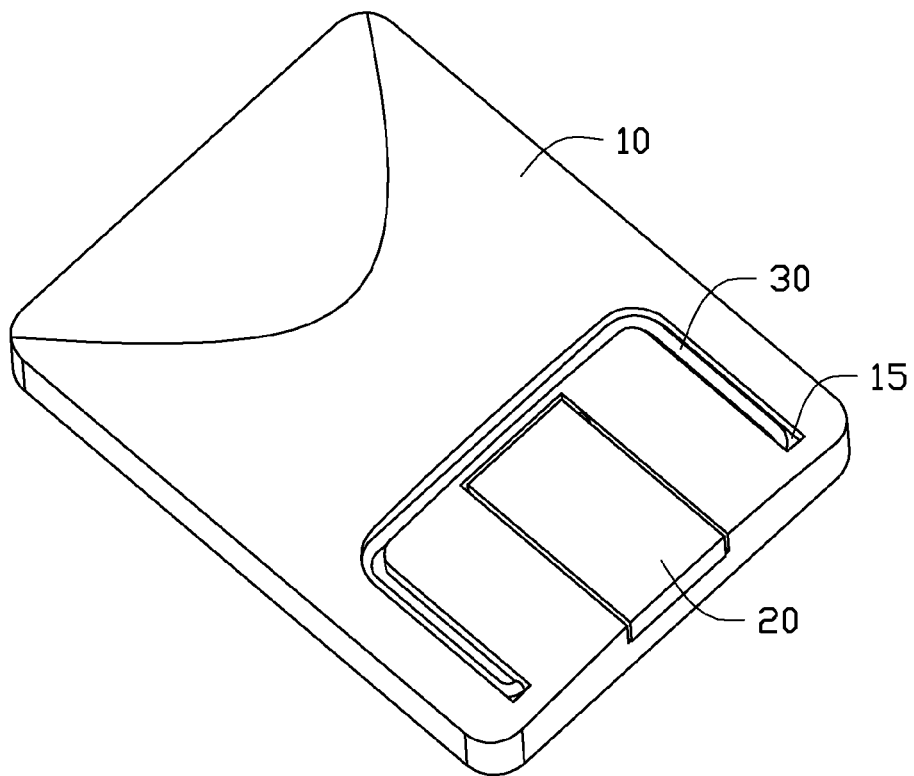
FIG. 3 is an assembled view of the projection device of FIG. 2, showing a projection module and a support member in their original, folded positions.
Figure 4:
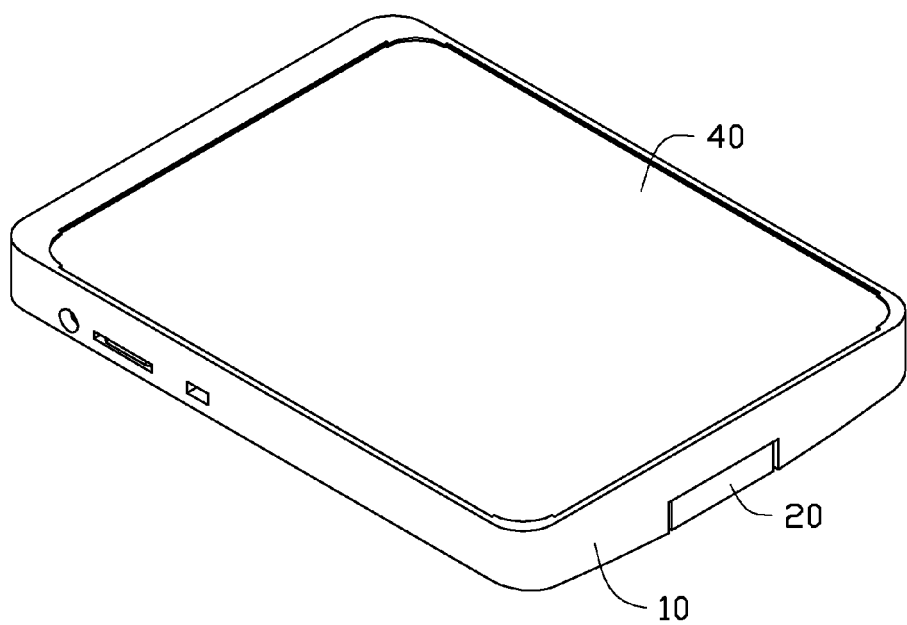
FIG. 4 is similar to FIG. 3, but viewed from another aspect.
Figure 5:
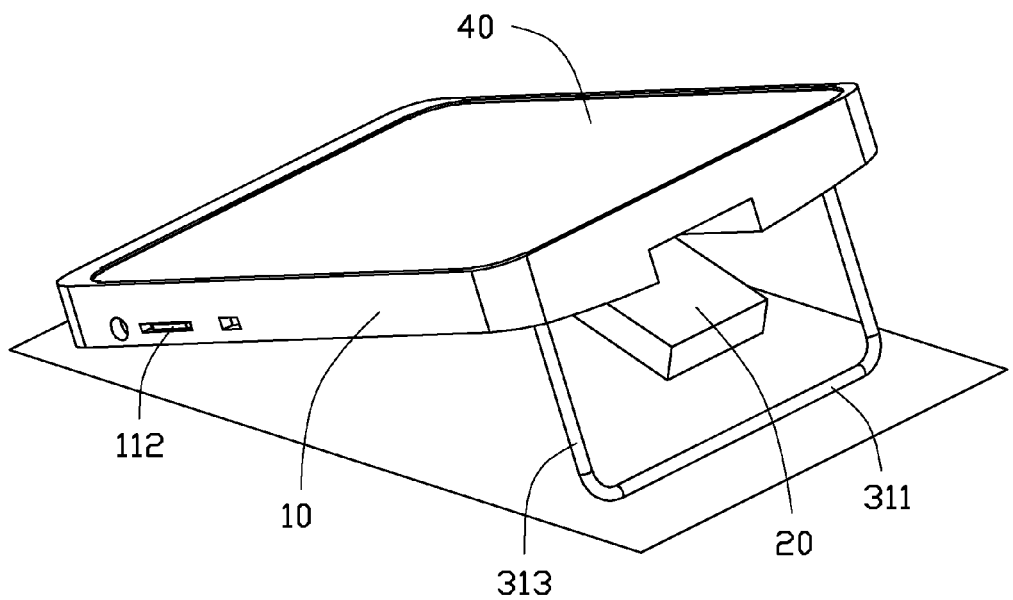
FIG. 5 is an assembled view of the projection device of FIG. 1, showing each of the projection module and the support member in an unfolded position.

Referring to FIGS. 3 to 5, in assembly, the pivot post 21 is pivotably engaged with the first pivot hole 131. The projection module 20 is pivotably mounted in the cavity 13. The pair of pivot mounting ends 33 is pivotably engaged with the pair of second pivot holes 151. The support member 30 is pivotably mounted in the accommodating groove 15. The cover 40 is attached to the housing 10 for covering an opening surrounded by the pair of first side walls 11 and the pair of second side walls 16. When the projection module 20 and the support member 30 are rotated to their original, folded positions (see FIG. 3), the projection module 20 is fully received in the cavity 13, and the support member 30 is fully received in the accommodating groove 15.

To adjust a projection angle of the projection device, the projection module 20 and the support member 30 can be rotated to their unfolded positions (see FIG. 5). In one embodiment, a maximum rotation angle of the projection module 20 is about 32 degrees. A maximum rotation angle of the support member 30 is about 90 degrees. The projection module 20 is rotated in a clockwise direction. The support member 30 is rotated in an anti-clockwise direction. The projection module 20 can be fixed in any desired angle by friction between the pivot post 21 and the first pivot hole 131. The support member can be fixed in any desired angle by friction between the pair of pivot mounting ends 33 and the pair of second pivot holes 151.

While the present disclosure has been illustrated by the description in this embodiment, and while the embodiment has been described in considerable detail, it is not intended to restrict or in any way limit the scope of the appended claims to such details. Additional advantages and modifications within the spirit and scope of the present disclosure will readily appear to those skilled in the art. Therefore, the present disclosure is not limited to the specific details and illustrative examples shown and described.

What is claimed is:

1. A projection device comprising:
   a housing comprising a rear wall and a plurality of side walls extending from the rear wall, a cavity and an accommodating groove being defined in the rear wall;
   a projection module pivotably mounted in the cavity and rotatable along a first direction;
   a support member pivotably mounted in the accommodating groove and rotatable along a second direction that is reverse to the first direction; and
   a cover attached to the housing for covering an opening surrounded by the plurality of side walls.

2. The projection device of claim 1, wherein a first pivot hole is defined in the rear wall and located beside the cavity, and the projection module comprises a pivot post pivotably engaged with the first pivot hole.

3. The projection device of claim 2, wherein a pair of second pivot holes is defined in the rear wall and located beside two ends of the accommodating groove, and the support member comprises a pair of pivot mounting ends pivotably engaged with the pair of second pivot holes.

4. The projection device of claim 3, wherein the cavity has a rectangular shape, and the accommodating groove has a U-shape.

5. The projection device of claim 4, wherein the projection module comprises a rectangular portion and an arc-shaped portion connected with the rectangular portion, and the pivot post protrudes from a side surface of the arc-shaped portion.

6. The projection device of claim 5, wherein the arc-shaped portion becomes thinner gradually.

7. The projection device of claim 4, wherein the support member comprises a horizontal part and a pair of vertical parts extending from opposite ends of the horizontal part, and the pair of pivot mounting ends extends substantially perpendicularly from the pair of vertical parts.

8. The projection device of claim 7, wherein the support member is integrally formed and made from a long, slim rod.

9. The projection device of claim 1, further comprising a plurality of power cells for supplying electric power to the projection device, a pair of speakers for output audio signals, and a circuit board for controlling the plurality of power cells and the projection module.

10. The projection device of claim 9, wherein the pair of speakers is located beside opposite sides of the cavity, and the pair of speakers and the cavity are located between opposite sides of the accommodating groove.

11. A projection device comprising:
    a housing comprising a rear wall and a plurality of side walls extending from the rear wall, a cavity and an accommodating groove being defined in the rear wall;
    a projection module pivotably mounted in the cavity;
    a support member pivotably mounted in the accommodating groove; and
    a cover attached to the housing for covering an opening surrounded by the plurality of side walls;
    wherein the projection module is rotatable along a first direction for adjusting a projection angle of the projection device, and the support member is rotatable along a second direction for adjusting the projection angle of the projection device.

12. The projection device of claim 11, wherein a first pivot hole is defined in the rear wall and located beside the cavity, and the projection module comprises a pivot post pivotably engaged with the first pivot hole.

13. The projection device of claim 12, wherein a pair of second pivot holes is defined in the rear wall and located beside two ends of the accommodating groove, and the support member comprises a pair of pivot mounting ends pivotably engaged with the pair of second pivot holes.

14. The projection device of claim 13, wherein the projection module comprises a rectangular portion and an arc-shaped portion connected with the rectangular portion, and the pivot post protrudes from a side surface of the arc-shaped portion.

15. The projection device of claim 14, wherein the arc-shaped portion becomes thinner gradually.

16. The projection device of claim 13, wherein the support member comprises a horizontal part and a pair of vertical parts extending from opposite ends of the horizontal part, and the pair of pivot mounting ends extends substantially perpendicularly from the pair of vertical parts.

17. The projection device of claim 16, wherein the support member is integrally formed and made from a long, slim rod.

18. The projection device of claim 11, further comprising a plurality of power cells for supplying electric power to the projection device, a pair of speakers for output audio signals, and a circuit board for controlling the plurality of power cells and the projection module.

19. The projection device of claim 18, wherein the pair of speakers is located beside opposite sides of the cavity, and the pair of speakers and the cavity are located between opposite sides of the accommodating groove.

20. The projection device of claim 11, wherein a maximum rotation angle of the support member is about 90 degrees, and a maximum rotation angle of the projection module is about 32 degrees.

* * * * *